(12) United States Patent
Wang

(10) Patent No.: US 10,998,258 B2
(45) Date of Patent: May 4, 2021

(54) CIRCUIT CARRIER AND MANUFACTURING METHOD THEREOF

(71) Applicant: Unimicron Technology Corp., Taoyuan (TW)

(72) Inventor: Tzu-Hsuan Wang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/595,491

(22) Filed: Oct. 8, 2019

(65) Prior Publication Data
US 2021/0050288 A1 Feb. 18, 2021

(30) Foreign Application Priority Data
Aug. 12, 2019 (TW) ................................. 108128625

(51) Int. Cl.
*H01L 23/498* (2006.01)
*H01L 23/13* (2006.01)
*H01L 23/367* (2006.01)
*H01L 21/48* (2006.01)

(52) U.S. Cl.
CPC .... *H01L 23/49822* (2013.01); *H01L 21/4857* (2013.01); *H01L 23/13* (2013.01); *H01L 23/367* (2013.01)

(58) Field of Classification Search
CPC . H01L 23/49822; H01L 23/13; H01L 23/367; H01L 21/4857
See application file for complete search history.

(56) References Cited

U.S. PATENT DOCUMENTS

| 2003/0098179 | A1* | 5/2003 | Obata | ................. H05K 3/4614 174/262 |
| 2007/0108596 | A1* | 5/2007 | Yu | ........................ H01L 21/568 257/706 |
| 2014/0355215 | A1* | 12/2014 | Canete | ................ H01L 23/3677 361/720 |

FOREIGN PATENT DOCUMENTS

| TW | 454277 B | 9/2001 |
| TW | M369636 U | 11/2009 |
| TW | 201507555 A | 2/2015 |
| TW | I611538 B | 1/2018 |

* cited by examiner

*Primary Examiner* — Herve-Louis Y Assouman
(74) *Attorney, Agent, or Firm* — CKC & Partners Co., LLC

(57) ABSTRACT

A circuit carrier includes a substrate, a laminar circuit structure, a metal heat slug, a first fixing piece, and a second fixing piece. The laminar circuit structure is disposed over the substrate and includes a plurality of dielectric layers and circuits in the dielectric layers. The metal heat slug is disposed in the laminar circuit structure. The first fixing piece is disposed on the first side of the upper surface of the metal heat slug. The second fixing piece is disposed on the second side of the upper surface of the metal heat slug, wherein the first side is perpendicular to the second side. A method of manufacturing a circuit carrier is also provided herein.

10 Claims, 19 Drawing Sheets

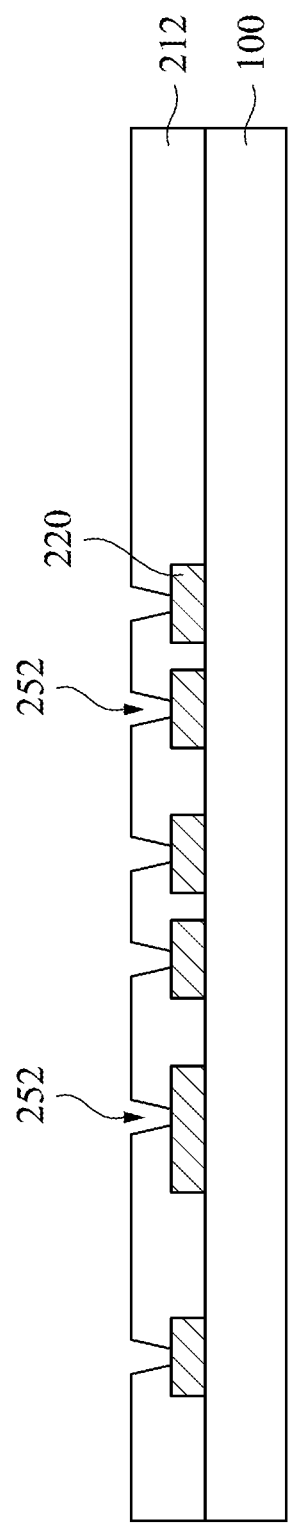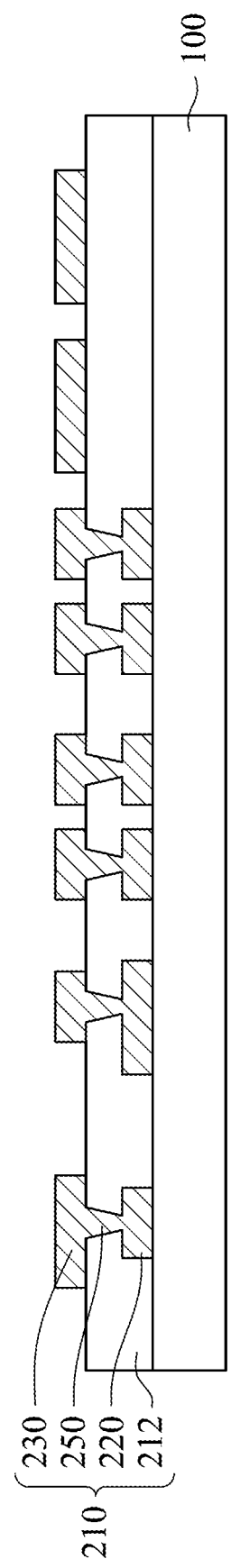

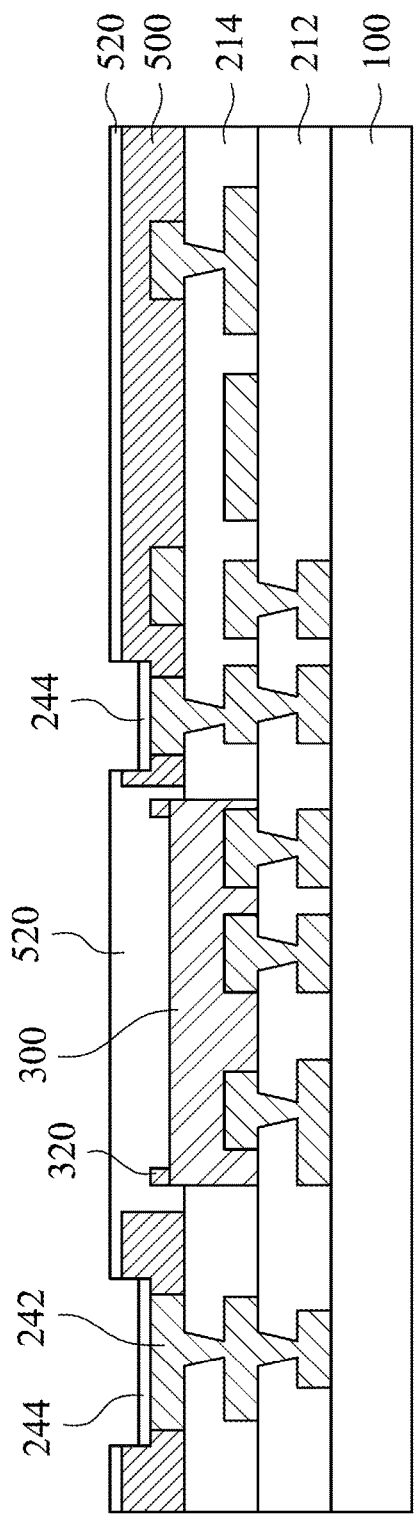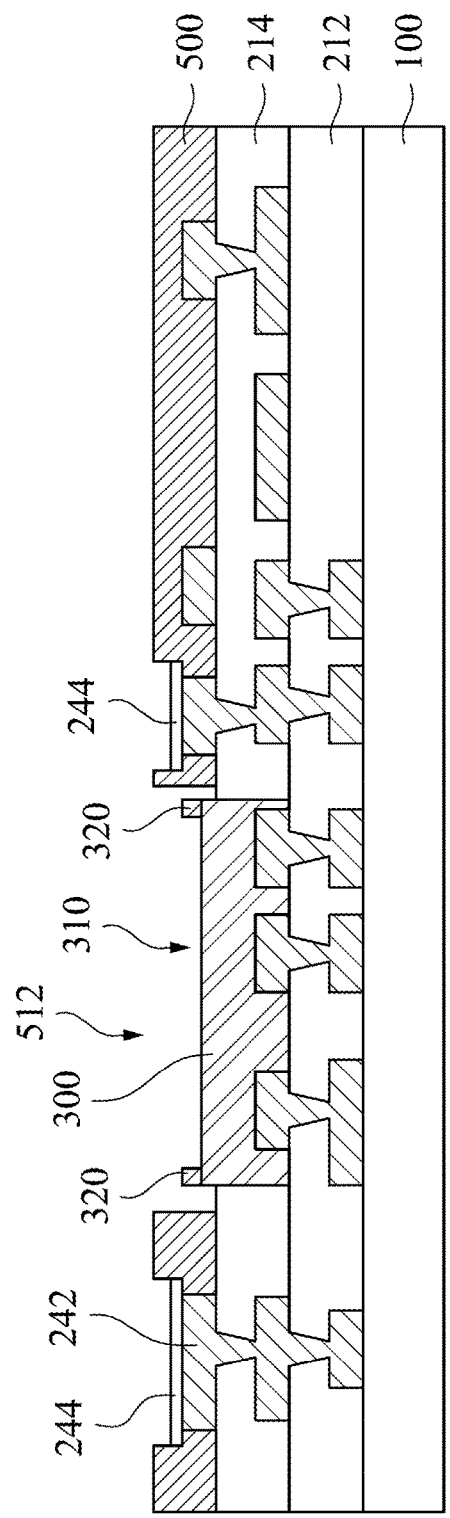

CIRCUIT CARRIER AND MANUFACTURING METHOD THEREOF

CROSS-REFERENCE TO RELATED APPLICATION

This application claims priority to Taiwan Application Serial Number 108128625, filed Aug. 12, 2019, which is herein incorporated by reference in its entirety.

BACKGROUND

Field of Invention

The present disclosure relates to a circuit carrier structure, particularly a circuit carrier structure having positioning function.

Description of Related Art

Generally, when a chip is bonded to a circuit carrier, the chip is mostly disposed on the upper surface of the laminar circuit structure of the circuit carrier. Because the circuit carrier has no fixing structure for fixing the chip, the shift of the chip easily occurs during the placement of the chip. Such shift may easily cause critical impact on the accuracy of the subsequent packaging processes.

The shift of the chip may cause the vias or circuits cannot be formed accurately in the subsequent processes. Therefore, how to reduce the shift of the chip in the circuit carrier is a critical issue that needs to be solved.

SUMMARY

One aspect of the present disclosure provides a circuit carrier comprising a substrate, a laminar circuit structure, a metal heat slug, a first fixing piece, and a second fixing piece. The laminar circuit structure is disposed on the substrate and comprises a plurality of dielectric layers and circuits in the dielectric layers. The metal heat slug is disposed in the laminar circuit structure. The first fixing piece is disposed on a first side of the upper surface of the metal heat slug. The second fixing piece is disposed on a second side of the upper surface of the metal heat slug, wherein the first side is perpendicular to the second side.

In some embodiments, the first fixing piece and the second fixing piece are configured to position an electronic component disposed on the metal heat slug.

In some embodiments, the first fixing piece is connected to the second fixing piece.

In some embodiments, the fixing piece and the second fixing piece are separated from each other.

In some embodiments, the circuit carrier further comprises a third fixing piece and a fourth fixing piece. In addition, the first fixing piece, the second fixing piece, the third fixing piece, and the fourth fixing piece are respectively located on one of the sides of the upper surface of the metal heat slug.

In some embodiments, the metal heat slug contacts a portion of the circuits.

In some embodiments, the material of the first fixing piece and the second fixing piece is the same as the material of the metal heat slug.

Another aspect of the present disclosure provides a method for manufacturing a circuit carrier; the method comprises: forming a precursor laminar circuit structure on a substrate, wherein the precursor laminar circuit structure comprises a first dielectric layer and a patterned circuit layer; disposing a metal heat slug on the precursor laminar circuit structure; forming a second dielectric layer on the precursor laminar circuit structure, wherein the second dielectric layer surrounds the metal heat slug; and disposing a first fixing piece and a second fixing piece on the upper surface of the metal heat slug, wherein the first fixing piece is located on the first side of the upper surface, the second fixing piece is located on the second side of the upper surface, and the first side is perpendicular to the second side.

In some embodiments, the step of disposing the metal heat slug on the precursor laminar circuit structure comprises: deposing a metal material over the precursor laminar circuit structure to form the metal heat slug; or bonding a metal block with the precursor laminar circuit structure.

In some embodiments, the step of disposing the first fixing piece and the second element on the upper surface of the metal heat slug comprises: defining positions for the first fixing piece and the second fixing piece by a lithography process; and forming the first fixing piece and the second fixing piece on the positions by a deposition process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 22 are schematic cross-sectional views of the various intermediate structures of a circuit carrier at various manufacturing stages.

DETAILED DESCRIPTION

Figure 1A:
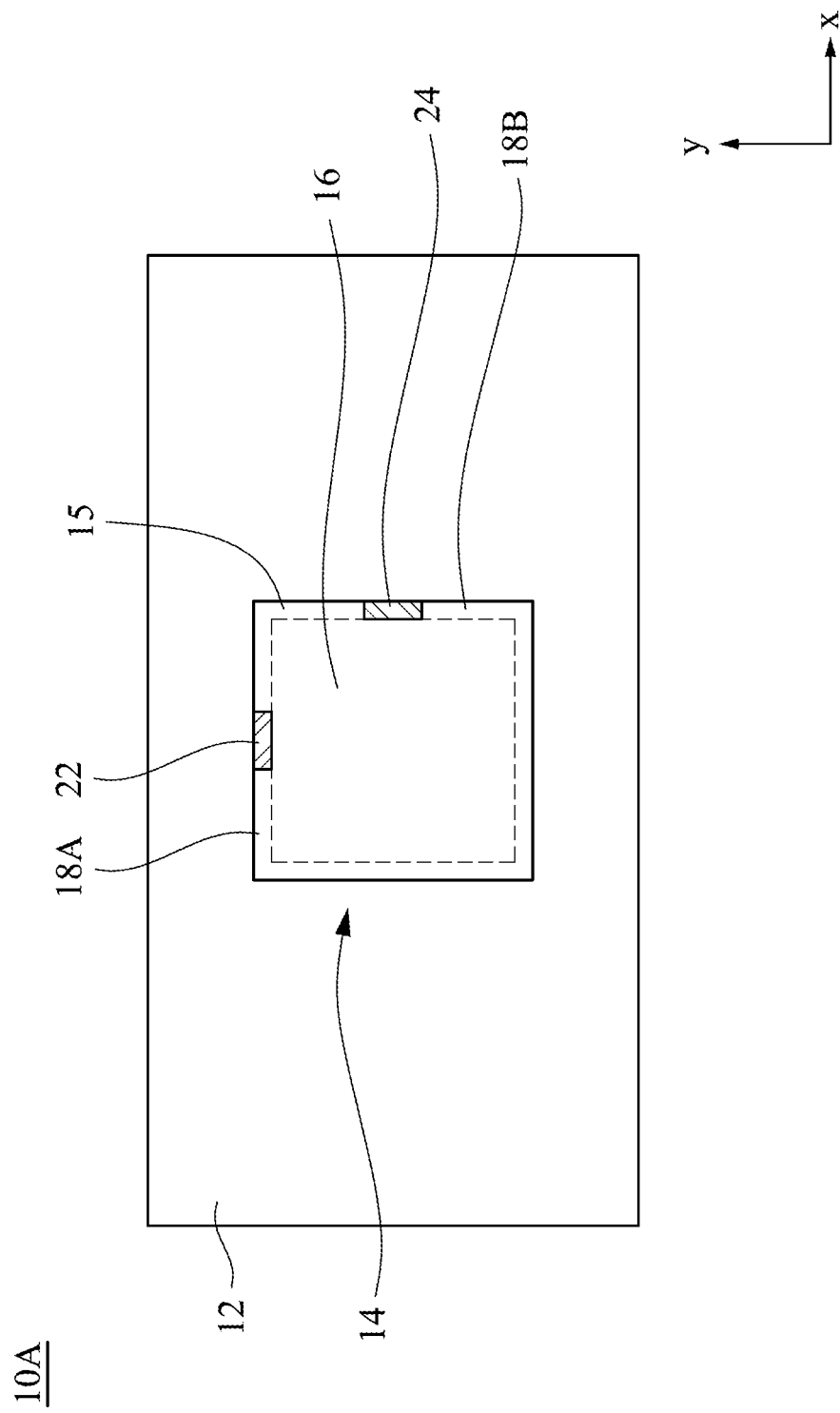
FIGS. 1A through 1E are schematic top views of a circuit carrier in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

While the method of the present disclosure is described below as a series of operations or steps, it will be appreciated that the illustrated order of such operations or steps should not be interpreted to be limiting for the present disclosure. For example, some of the operations or steps may be performed in a different order and/or simultaneously with other operations or steps. In addition, not all of the illustrated operations, steps, and/or characteristics are required to implement the embodiments of the present disclosure. Further, each of the operations or steps depicted herein may include several sub-steps or actions.

FIG. 1A illustrates a schematic top view of a circuit carrier 10A. In the circuit carrier 10A, a laminar circuit structure 12 surrounds a metal heat slug 14. The upper surface 15 of the metal heat slug 14 has an electronic component placement area 16 configured to place an electronic component (e.g., a chip). A first fixing piece 22 and a second fixing piece 24 are respectively disposed on two of the sides of the upper surface 15 of the metal heat slug 14. The first fixing piece 22 is located on the first side 18A of the upper surface 15 of the metal heat slug 14. The second fixing piece 24 is located on the second side 18B of the upper surface 15 of the metal heat slug 14. The first side 18A is perpendicular to the second side 18B.

The first fixing piece 22 is configured to position the electronic component to be placed in the first direction (i.e., the y direction), and the second fixing piece 24 is configured to position the electronic component in the second direction (i.e., the x direction).

In the circuit carrier of FIG. 1A, the first fixing piece 22 and the second fixing piece 24 are spaced apart from each other. In other alternative embodiments, the first fixing piece and the second fixing piece may be connected, or other fixing pieces may be disposed on other sides of the upper surface 15 of the metal heat slug 14.

Figure 1B:
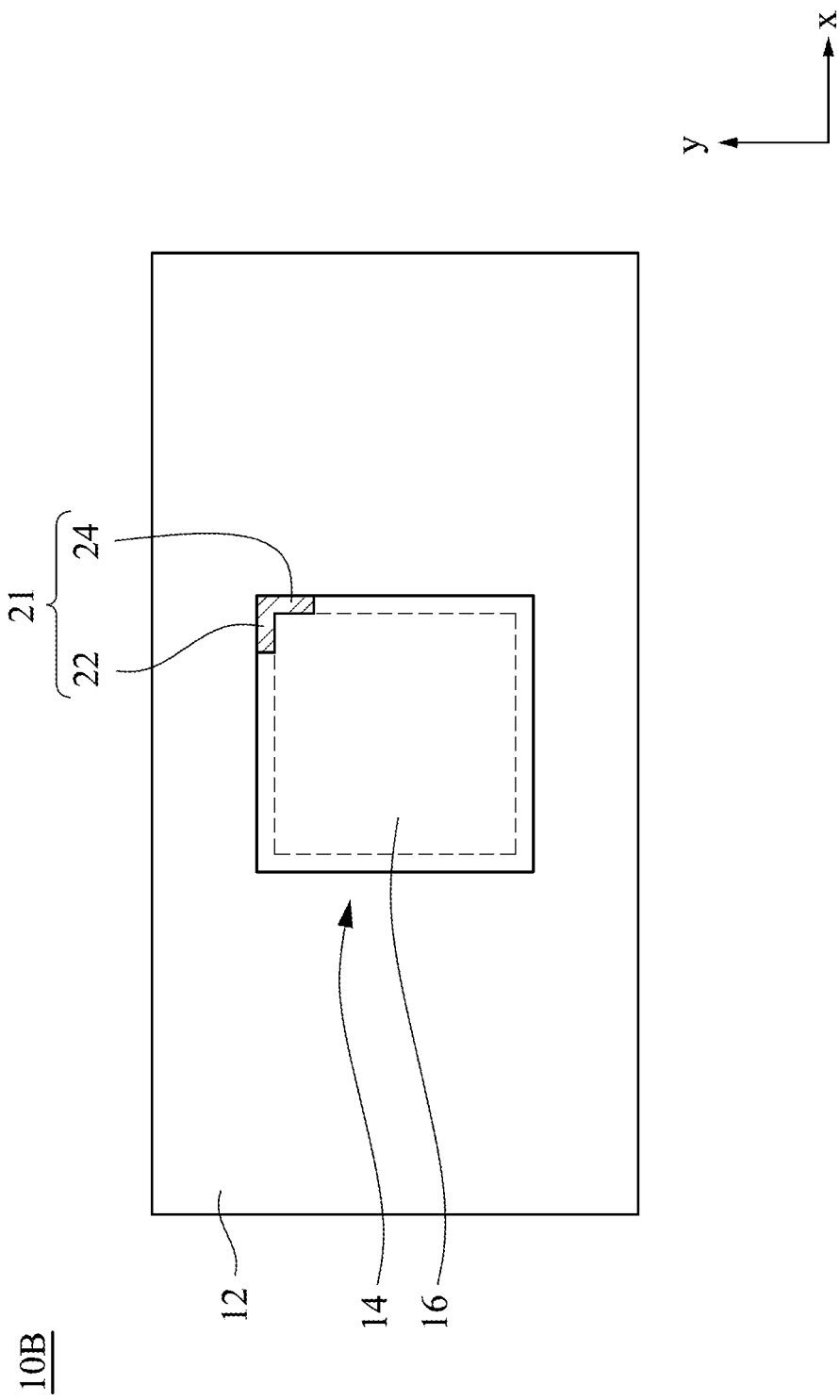

FIG. 1B illustrates a schematic top view of the circuit carrier 10B. In the circuit carrier 10B, the first fixing piece 22 is connected to the second fixing piece 24; therefore, the first fixing piece 22 and the second fixing piece 24 are together formed as a positioning structure 21 having a right angle and located at a corner of the electronic component placement area 16. Consequently, one of the corners of the electronic component to be placed will abut against the positioning structure 21 in both the first direction (i.e., the y direction) and the second direction (i.e., the x direction).

Figure 1C:
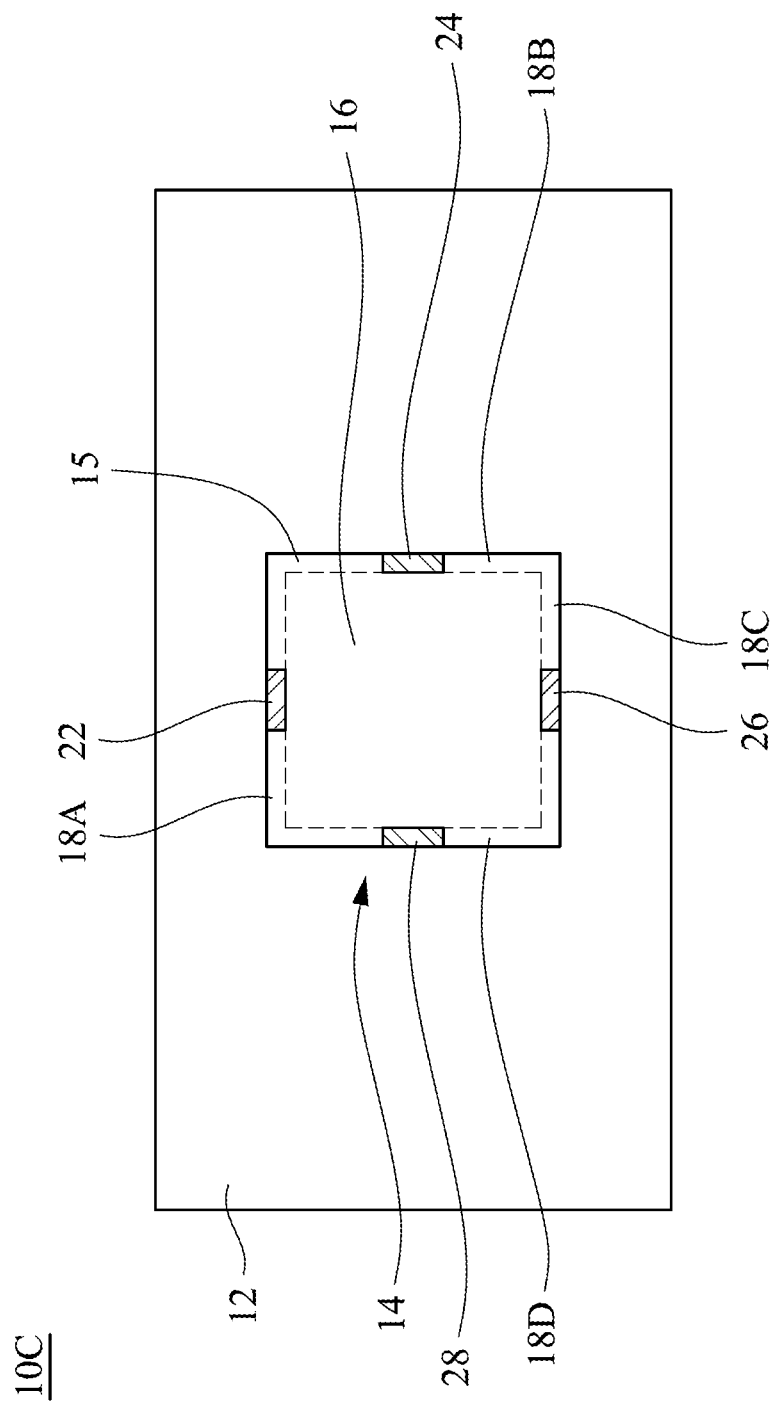

FIG. 1C shows a schematic top view of a circuit carrier 10C of another alternative embodiment. In the circuit carrier 10C, a third fixing piece 26 and a fourth fixing piece 28 are disposed on the other two sides of the upper surface 15 of the metal heat slug 14; wherein the third fixing piece 26 is located on a third side 18C of the upper surface 15 of the metal heat slug 14; the fourth fixing piece 28 is located on the fourth side 18D of the upper surface 15 of the metal heat slug 14. Therefore, the fixing pieces are disposed on each of the outer sides of the electronic component placement area 16. Thus, after the electronic component is placed in the electronic component placement area 16, the electronic component will not shift from the electronic component placement area 16 because of the first, second, third, and fourth fixing pieces 22, 24, 26, and 28.

Figure 1D:
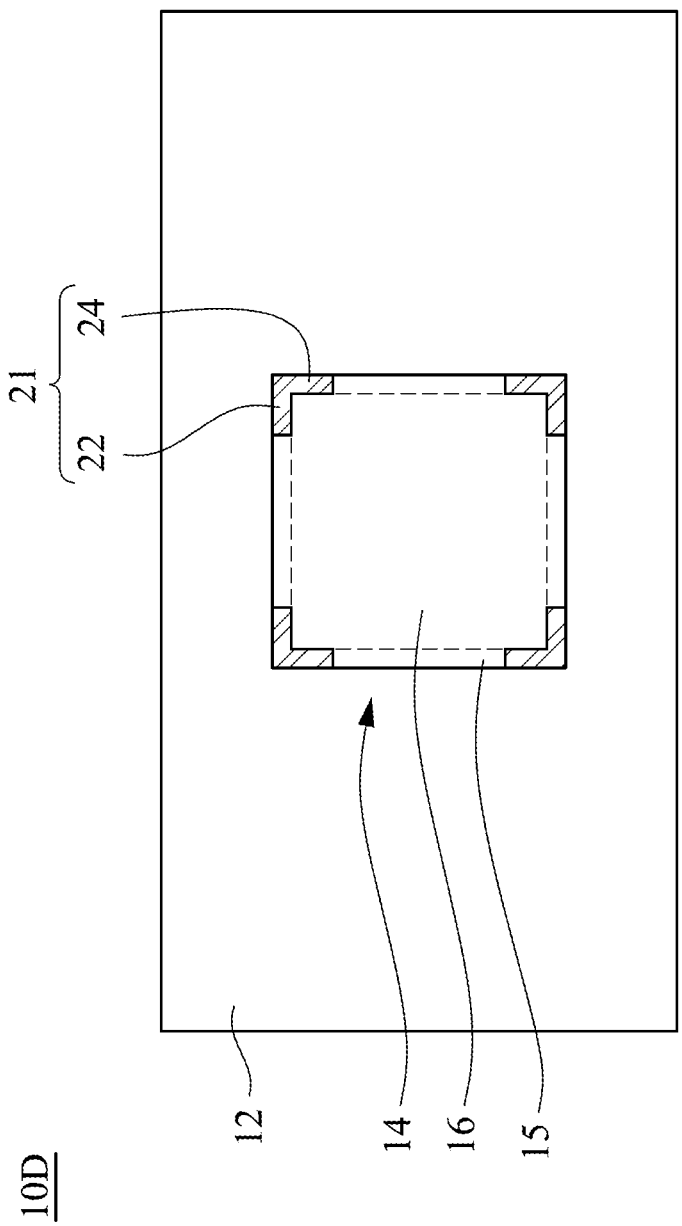

FIG. 1D is a schematic top view showing a circuit carrier 10D of another alternative embodiment. In the circuit carrier 10D, the positioning structures 21 are disposed at the four corners of the upper surface 15 of the metal heat slug 14. In other words, the fixing pieces (i.e., the positioning structures) are disposed at all of the outer corners the electronic component placement area 16. Therefore, after the electronic component is placed in the electronic component placement area 16, the four corners of the electronic component respectively abut against the four positioning structures 21. Accordingly, because the electronic component abuts against the positioning structures 21 at the four corners, the electronic component will not shift from the electronic component placement area 16.

Figure 1E:
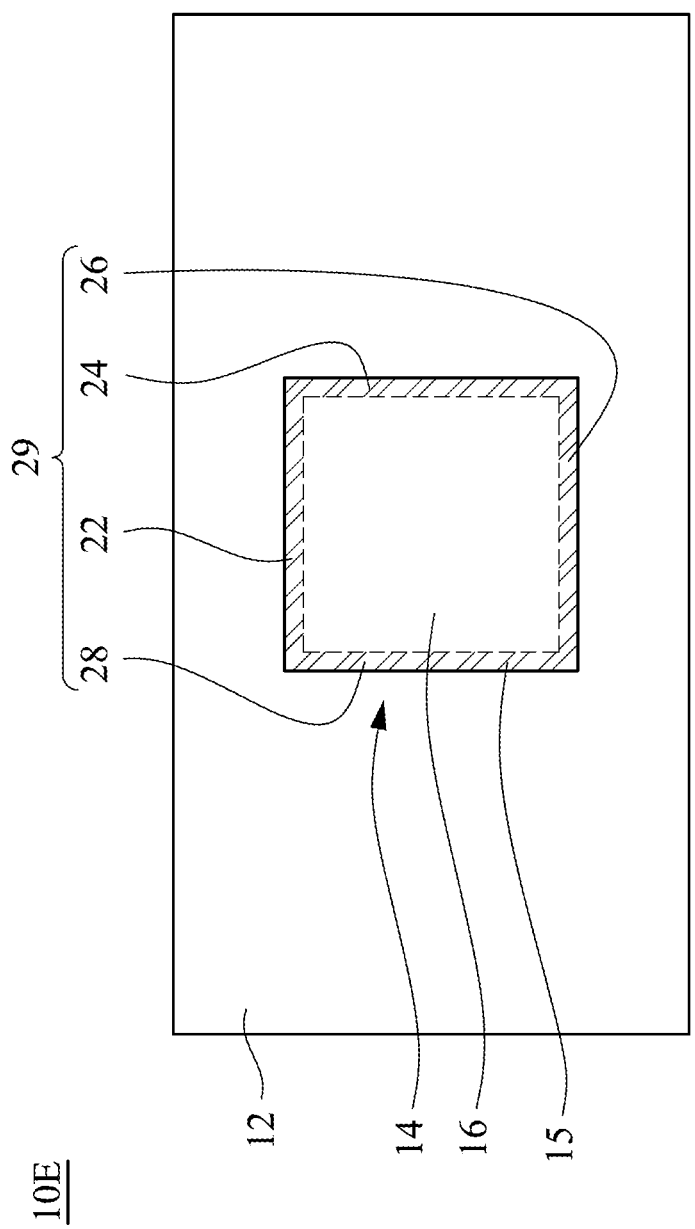

FIG. 1E is a schematic top view illustrating a circuit carrier 10E of yet another alternative embodiment. In the circuit carrier 10E, the first fixing piece 22, the second fixing piece 24, the third fixing piece 26, and the fourth fixing piece 28 disposed on the upper surface of the metal heat slug 14 are connected; in other words, these four fixing pieces 22, 24, 26 and 28 are formed as a frame structure 29 located around the outside of the electronic component placement area 16. Therefore, after the placement of the electronic component, via the frame structure 29, the electronic component will not shift from the electronic component placement area 16.

Figure 1F:
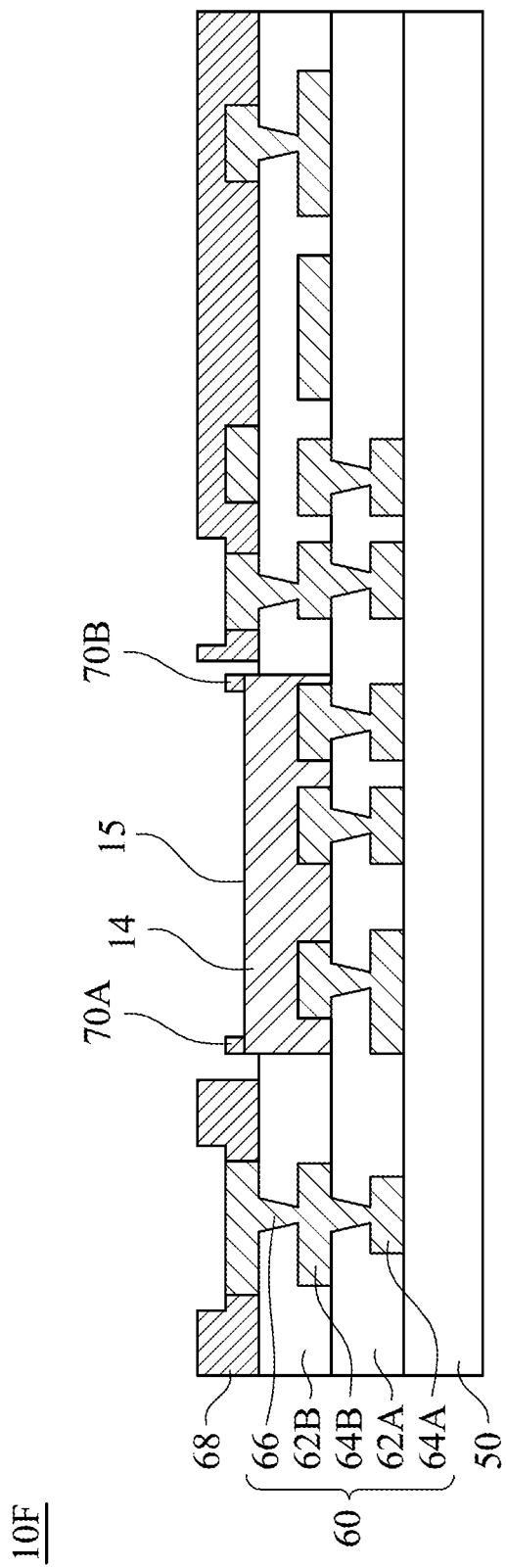
FIG. 1F is a schematic cross-sectional view of a circuit carrier in accordance with some embodiments.

FIG. 1F is a cross-sectional view of a circuit carrier 10F. The circuit carrier 1OF comprises a substrate 50, a laminar circuit structure 60, a metal heat slug 14, and fixing pieces 70A and 70B. The laminar circuit structure 60 is disposed over the substrate 50; the laminar circuit structure 60 includes a plurality of dielectric layers 62A and 62B and also includes circuit 64A and 64B in the dielectric layers 62A and 62B. The metal heat slug 14 is embedded in the laminar circuit structure 60. The fixing pieces 70A and 70B are respectively disposed on two sides of the upper surface 15 of the metal heat slug 14. It should be noted that FIG. 1F is a cross-sectional view; therefore, a fixing piece on another side of the upper surface 15 of the metal heat slug 14 may be not shown in this figure. Further, in other embodiments, the fixing piece may be shown on only one side of the upper surface of the metal heat slug in the cross-sectional view.

Please still refer to FIG. 1F, the laminar circuit structure 60 also includes vias 66 electrically connected to the circuits 64A and 64B. Further, a solder mask layer 68 is disposed over the laminar circuit structure 60 to protect the laminar circuit structure 60.

The circuit carrier provided in the embodiments of the present disclosure can be applied to, for example, but not limited, a circuit layer having a wire bonded electronic component (e.g., a chip). The function of the fixing pieces in the circuit carrier is to position the electronic component, so that the fixing pieces facilitate reducing the shift of the electronic component during the placement or before curing the adhesive layer in the circuit carrier.

Figure 2A:
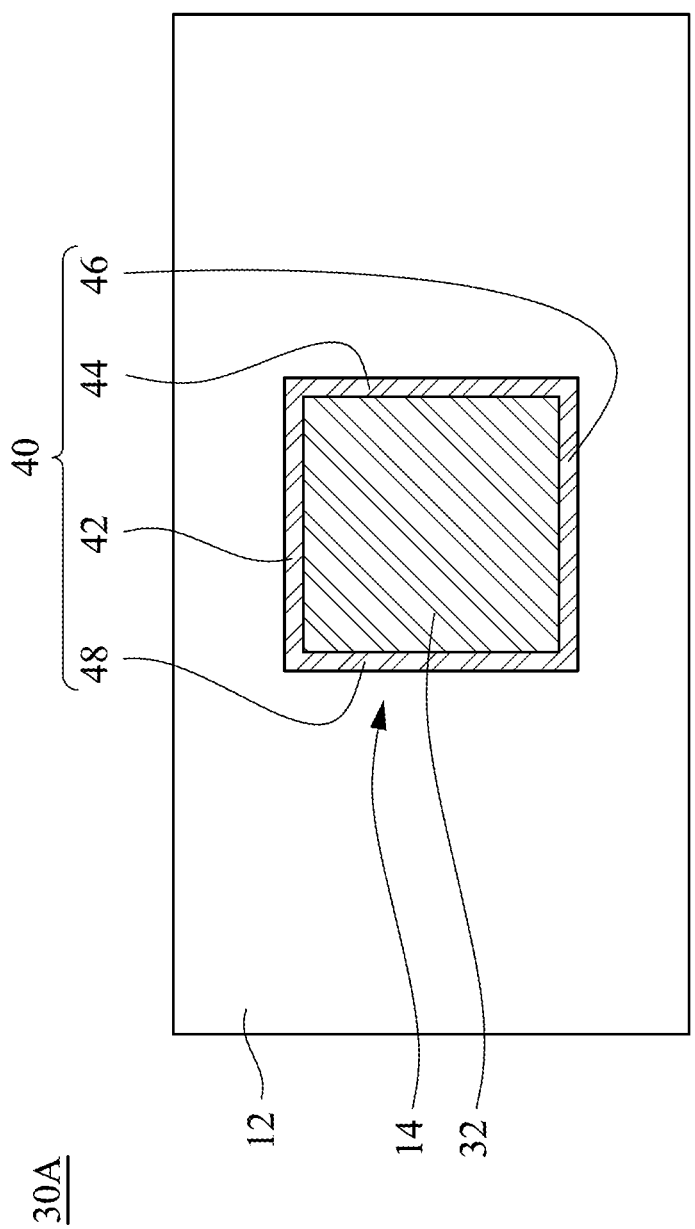
FIG. 2A is a schematic top view of a circuit carrier in accordance with some embodiments.
Figure 2B:
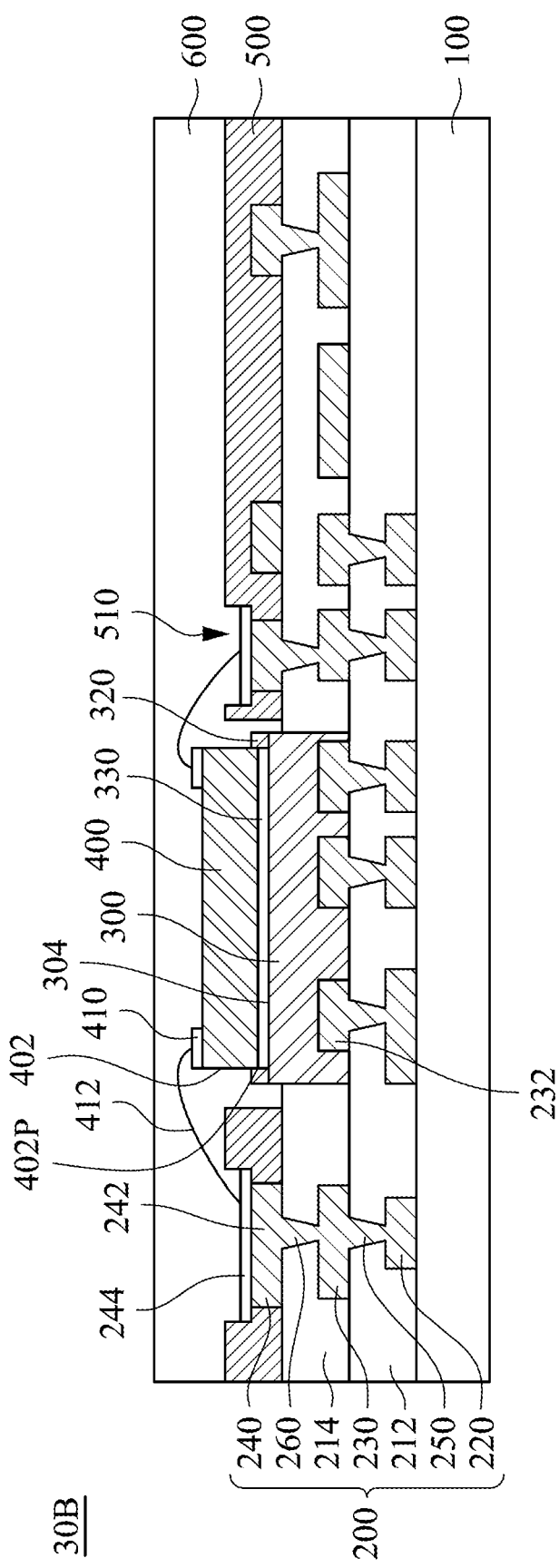
FIG. 2B is a schematic cross-sectional view of a circuit carrier in accordance with some embodiments.

FIG. 2A is a schematic top view illustrating an exemplary circuit carrier 30A. In the circuit carrier 30A, the chip 32 is placed on a chip placement area (not labeled) on the upper surface of the metal heat slug 14, and a frame structure 40 is disposed around the chip 32; in other words, the four parts of the frame structure 40, i.e., the first, the second, the third, and fourth fixing pieces 42, 44, 46, and 48 define the position of the chip placement area and prevent the chip 32 from shifting out of the chip placement area. FIG. 2B is a schematic cross-sectional view of the circuit carrier 30B. The circuit carrier 30B includes a substrate 100, a laminar circuit structure 200, a metal heat slug 300, fixing pieces 320, a chip 400, a solder mask layer 500, and a molding layer 600.

It should be noted that in the cross-sectional view shown in FIG. 2B, the two fixing pieces 320 are respectively on two sides of the upper surface of the metal heat slug 300. In other embodiments, the fixing piece 320 may be shown on only one side of the upper surface of the metal heat slug 300 in the cross-sectional view.

The bottom of the circuit carrier 30B is a substrate 100. The laminar circuit structure 200 is disposed over the substrate 100 and includes a first dielectric layer 212, a second dielectric layer 214, and patterned circuit layers, such as a first patterned circuit layer 220 in the first dielectric layer 212 and a second patterned circuit layer 230 in the second dielectric layer 214. In some embodiments, the third patterned circuit layer 240 is disposed over the second dielectric layer 214. The laminar circuit structure 200 further includes a plurality of first vias 250 electrically connected to the first patterned circuit layer 220 and the second patterned circuit layer 230. The laminar circuit structure 200 also includes a plurality of second vias 260 electrically connected the second patterned circuit layer 230 and the third patterned circuit layer 240. The laminar circuit structure 200 can be formed through performing build-up processes, in which the dielectric layers, the patterned circuit layers, and vias are formed; the numbers of the build-up process and the layers of the laminar circuit structure are not limited but can be adjusted according to demand.

The metal heat slug 300 is embedded in the laminar circuit structure 200. The lower portion of the metal heat slug 300 contacts a first circuit portion 232 of the second patterned circuit layer 230.

The fixing pieces 320 are disposed on the upper surface 304 of the metal heat slug 300, i.e., the fixing pieces 320 are similar to a flange or a frame structure formed on the upper surface 304 of the metal heat slug 300. The material of the fixing pieces 320 may be the same as the material of the metal heat slug 300; in other words, the fixing piece 320 and the metal heat slug 300 may be formed as a unitary structure.

The chip 400 is disposed on the upper surface 304 of the metal heat slug 300 and sandwiched between the fixing pieces 320 on both sides. The bottom surface of the chip 400 contacts the upper surface 304 of the metal heat slug 300, and at least a portion (e.g., the first portion 402P) of the side 402 of the chip 400 contacts the fixing piece 320. The contact may be direct contact or indirect contact, for example, optionally, an adhesive layer 330 (e.g., a thermal grease) may be coated on the upper surface 304 of the metal heat slug 300.

The solder mask layer 500 is disposed over the laminar circuit structure 200 and surrounds the chip 400 to protect the underlying laminar circuit structure 200. The solder mask layer 500 has openings exposing the electrical connection pads 242 of the third patterned circuit layer 240 and the chip 400. The upper surface of the electrical connection pad 242 is a surface treatment layer 244. The pad 410 is disposed on the chip 400; one end of the wire 412 is bonded to the pad 410 on the chip 400, and the other end of the wire 412 is bonded to the electrical connection pad 242 of the third patterned circuit layer 240.

The molding layer 600 overlays the chip 400 and the solder mask layer 500 and fills the gaps between the chip 400 and the solder mask layer 500. The molding layer 600 protects the underlying chip 400, the wire 412, and the laminar circuit structure 200 from external influences.

In some embodiments of the present disclosure, in the circuit carrier, the fixing pieces are disposed on the upper surface of the metal heat slug to reduce the shift of the electronic component. In addition, since the material of the fixing pieces is the same as the metal of the metal heat slug (for example, the material comprises copper, aluminum, or other suitable metals, the contact area between the side of the electronic component and the metal heat slug is increased; therefore, the heat dissipation effect for the electronic component can also be increased.

FIGS. 3 through 22 are schematic cross-sectional views showing various intermediate structures in an exemplary method, in accordance with some embodiments.

Figure 3:
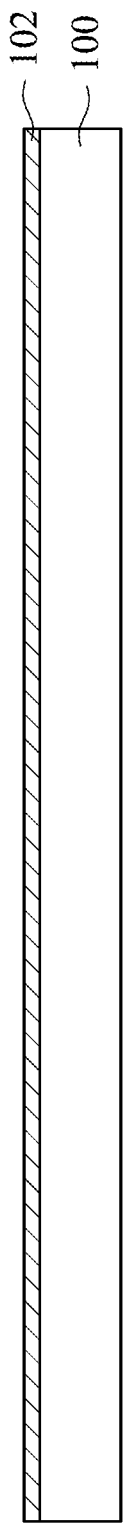

As shown in FIG. 3, at first, a substrate coated with a metal layer is provided. FIG. 3 illustrates a substrate 100 and a metal layer 102 on the substrate 100. In some embodiments, a substrate coated with copper foil, for example, resin coated copper (RCC) is provided. In some embodiment, the substrate 100 can be made of, for example, glass or other materials similar to glass. In other embodiments, the substrate 100 may comprise an organic polymer material, for example, epoxy, polyimide (PI), polyethylene terephthalate (PET), and/or bismaleimide triazine (BT), or the like. The metal layer 102 may comprise copper, aluminum, or other suitable electrically conductive materials.

Figure 4:
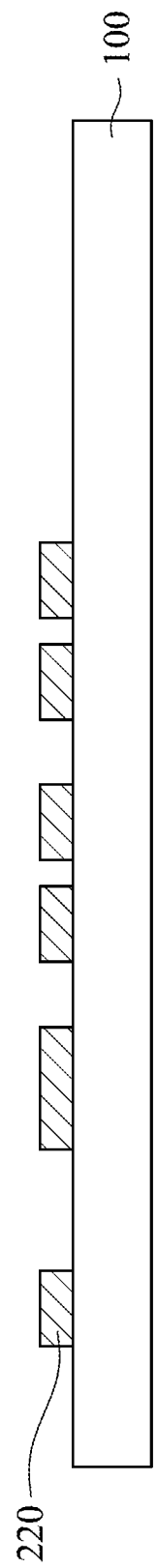

Next, a circuit layer is formed on the substrate and patterned. For example, the metal layer 102 is used as a seed layer, and a circuit layer (not shown) is formed by, for example, electroless plating, electroplating, or other plating methods; then a photoresist layer (not shown) is formed on the circuit layer, and parts of of the circuit layer are exposed through lithography process performed on the photoresist layer; then, the circuit layer is patterned through etching process using the photoresist layer as a mask; then, the photoresist layer is removed through removal process. As shown in FIG. 4, the first patterned circuit layer 220 is formed on the substrate 100.

Figure 5:
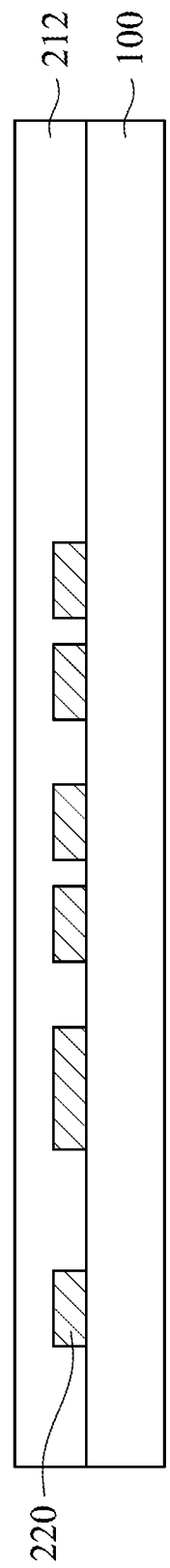

Next, as shown in FIG. 5, the first dielectric layer 212 is formed. The material of the first dielectric layer 212 comprises prepreg (PP), Ajinomoto build-up film (ABF), photoimageable dielectric (PID), resin, or the like. For example, the resin may be phenolic resin, epoxy resin, polyimide resin, or polytetrafluoroethylene. The method for forming the first dielectric layer 212 may comprise, for example, lamination, coating, or other suitable processes.

Next, as shown in FIG. 6, a plurality of first via openings 252 are formed in the first dielectric layer 212. The first via openings 252 expose parts of the first patterned circuit layer 220. In some embodiments, forming the first via openings 252 may include using, for example, laser-drilling process or exposure development process.

Then, as shown in FIG. 7, first vias 250 are formed, and a second patterned circuit layer 230 is formed. The first vias 250 and the second patterned circuit layer 230 may comprise, for example, copper, aluminum, or other suitable electrically conductive materials. Filling the first via openings 252 may be performed separately or simultaneously with forming the second patterned circuit layer 230. For example, an electrically conductive material is deposited on the first dielectric layer 212, and the first via openings are filled with the electrically conductive material, to form the first vias 250 and a circuit layer; then, a photoresist layer (not shown) such as a dry film is formed on the circuit layer; then, parts of the circuit layer are exposed through performing lithography process on the photoresist layer; then, the circuit layer is patterned through etching process using the photoresist layer as a mask. Thereafter, a photoresist layer removal process is performed to form the second patterned circuit layer 230. In other embodiments, at first, a photoresist layer (not shown) such as a dry film is formed on the first dielectric layer 212; then, the photoresist is patterned through lithography process to expose parts of the first dielectric layer 212 and the first via openings 252. Thereafter, a deposition process such as electroplating and a removal process for the photoresist layer are performed to form the first vias 250 and the second patterned circuit layer 230.

In this exemplary method for forming a circuit carrier, FIG. 7 depicts the precursor laminar circuit structure 210 on the substrate 100. The precursor laminar circuit structure 210 includes a first dielectric layer 212, a first patterned circuit layer 220, a second patterned circuit layer 230, and a plurality of first vias 250. In the circuit carrier, the first patterned circuit layer 220 is within the first dielectric layer 212. The second patterned circuit layer 230 is disposed on the first dielectric layer 212. The first vias 250 are electrically connected to the first patterned circuit layer 220 and the second patterned circuit layer 230. The number of layers of the dielectric layers and the patterned circuit layers are not limited in the present disclosure and can be adjusted according to demand.

Then, a metal block, such as a metal heat slug, is disposed over the precursor laminar circuit structure 210. The material of the metal block may be metal having good thermal conductivity, such as copper, aluminum, or other suitable metals. The metal block may be disposed through, for example, depositing a metal material over the precursor laminar circuit structure 210 to form the metal block, or bonding a metal block on the precursor laminar circuit structure 210. Please see the more detailed description below.

In some embodiments, the metal block can be placed to be in contact with a portion of the circuit. In other embodiments, the metal block can be placed to be isolated from the circuit.

Figure 8A:
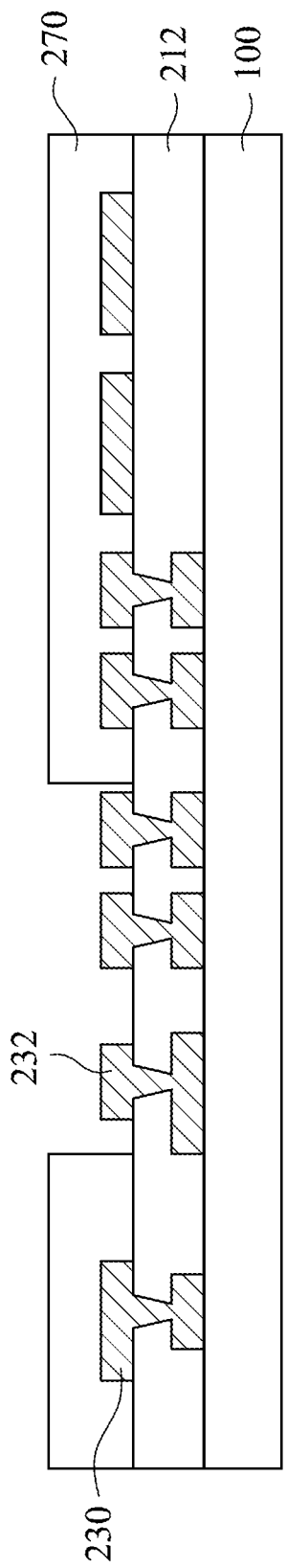
Figure 9:
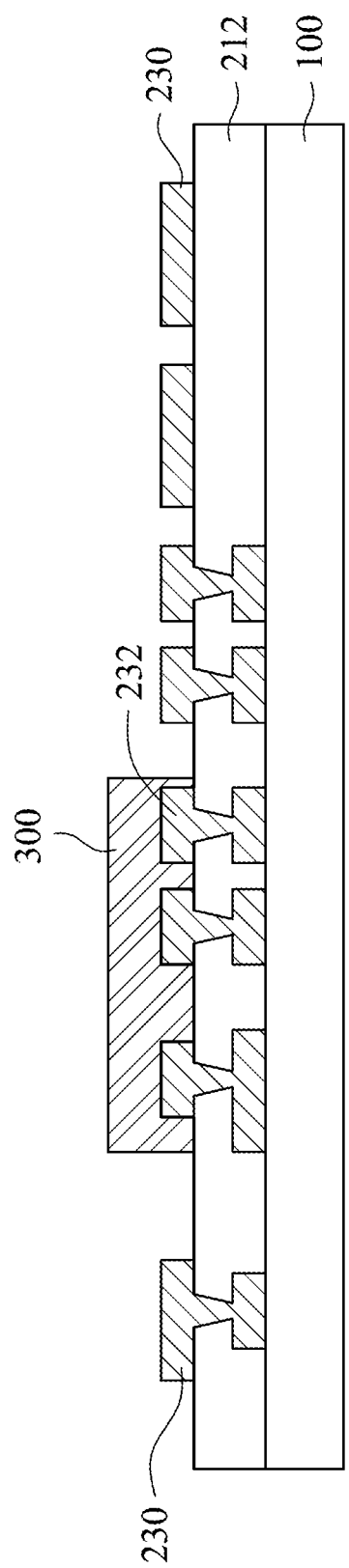

In some embodiments, as shown in FIGS. 8A and 9, a metal heat slug is formed by depositing a metal material on the precursor laminar circuit structure. At first, a photoresist layer 270 is formed on the first dielectric layer 212; then, the photoresist layer 270 is patterned by a lithography process to expose parts of the first dielectric layer 212 and a first circuit portion 232 of the second patterned circuit layer 230. Next, a deposition process (electroless plating, electroplating, sputtering, or the like) is performed to form the metal heat slug 300. Then, a removal process is performed to remove the photoresist layer 270. Thereafter, as shown in FIG. 9, the metal heat slug 300 is disposed on the first dielectric layer 212 and the first circuit portion 232.

Figure 8B:
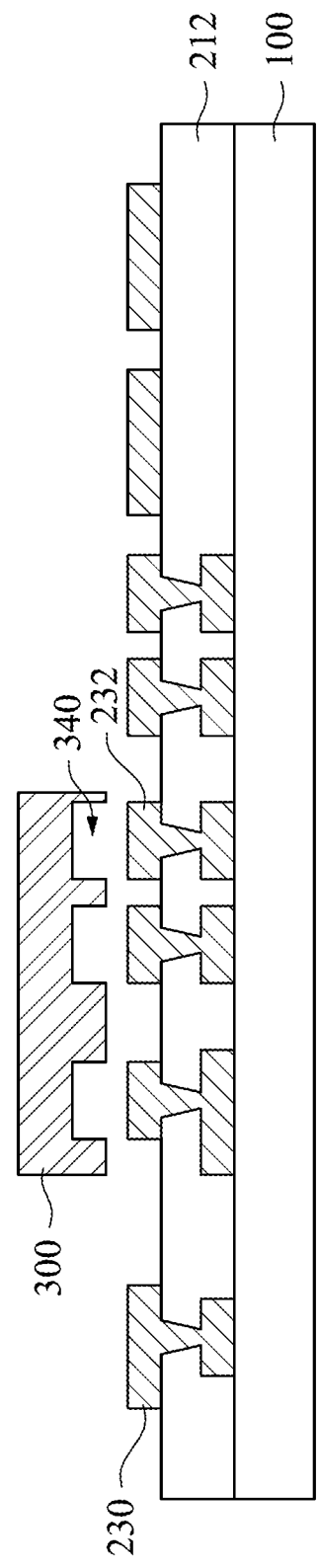

In other embodiments, the metal heat slug 300 may be formed in advance, and then the metal heat slug 300 is disposed on the precursor laminar circuit structure 210. As shown in FIG. 8, the lower portion of the metal heat slug 300 corresponds to the shape of the upper surface of the precursor laminar circuit structure. For example, the lower portion of the metal heat slug 300 has recesses 340 corresponding to the first circuit portion 232 of the second patterned circuit layer 230. Then, a bonding process, such as an ultrasonic soldering process or other suitable processes, is performed to bond the metal heat slug 300 with the first dielectric layer 212 and/or the first circuit portion 232. Thereafter, as shown in FIG. 9, the metal heat slug 300 is disposed on the first dielectric layer 212 and the first circuit portion 232.

Figure 10A:
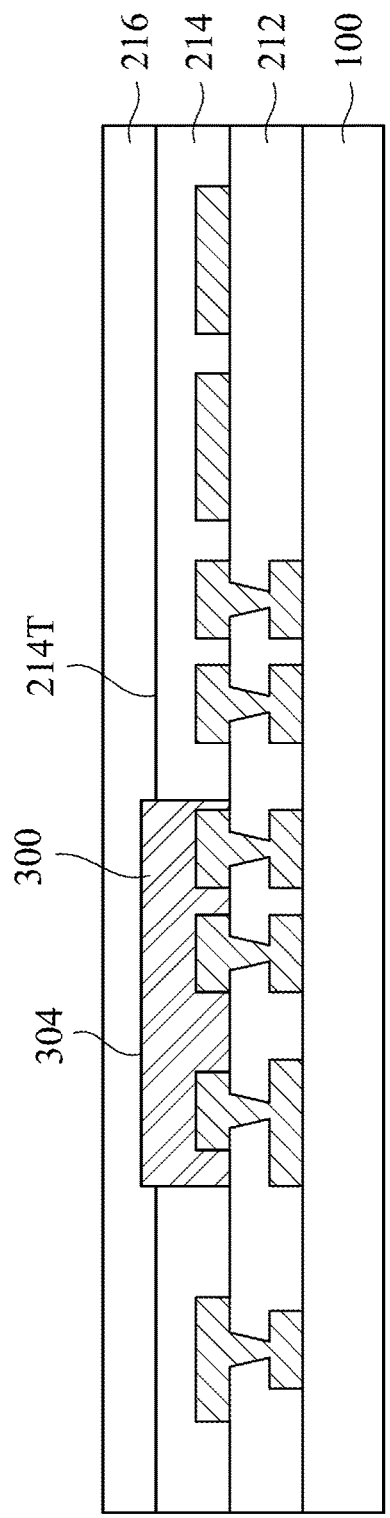

Next, as shown in FIG. 10A, a second dielectric layer 214 is formed. The second dielectric layer 214 may be formed by using, for example, lamination process or other suitable processes. At first, a second dielectric layer 214 is disposed over the first dielectric layer 212. The material of the second dielectric layer 214 may include prepreg (PP), Ajinomoto build-up film (ABF), photoimageable dielectric (PID), resin, or the like. For example, the resin may be phenolic resin, epoxy resin, polyimide resin, or polytetrafluoroethylene. Then, a buffer layer 216 for pressing is disposed on the second dielectric layer 214, and a pressing process is performed. The pressing process reduces the height of the second dielectric layer 214, for example, the top surface 214T of the second dielectric layer 214 is lower than the upper surface 304 of the metal heat slug 300, for example, lower than about 3 to 20 micrometers (μm), and more particularly, about 5 to 10 μm.

Figure 10B:
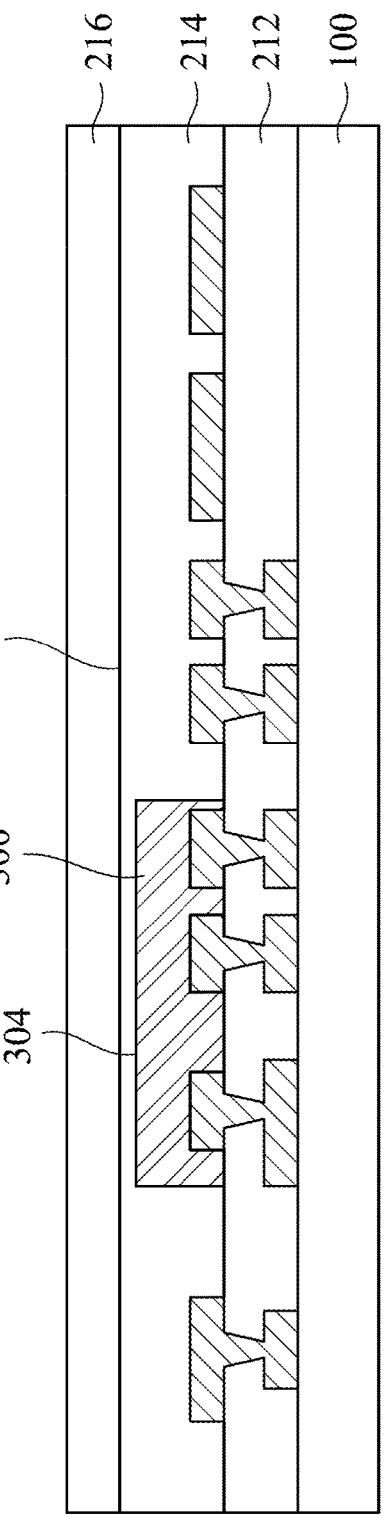

In other embodiments, as shown in FIG. 10B, the top surface 214T of the second dielectric layer 214 is higher than the upper surface 304 of the metal heat slug 300.

Figure 11:
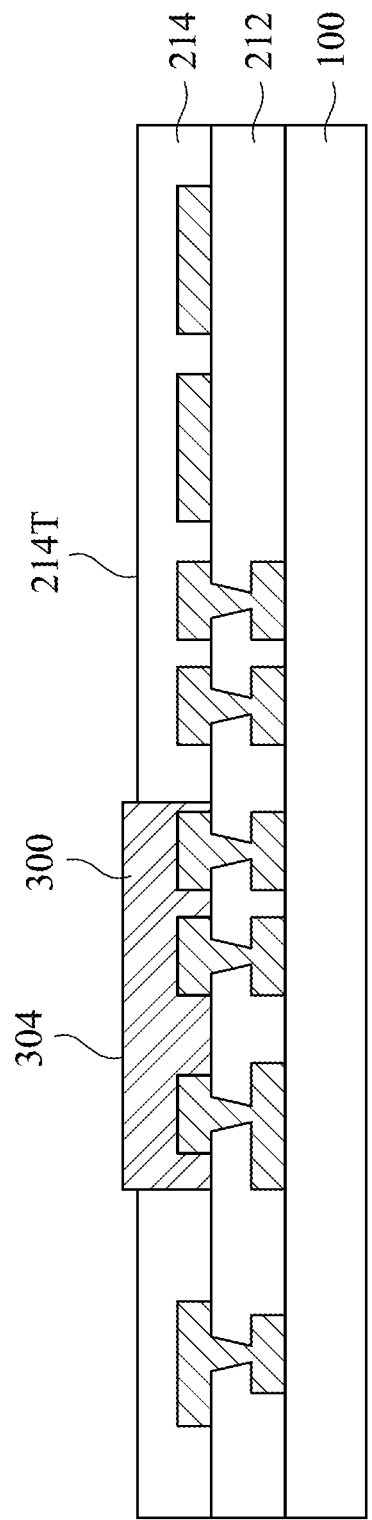

Next, as shown in FIG. 11, the buffer layer 216 is removed and the metal heat slug 300 is exposed. When the top surface 214T of the second dielectric layer 214 is lower than the upper surface 304 of the metal heat slug 300, the metal heat slug 300 is exposed after the buffer layer 216 is removed. When the top surface 214T of the second dielectric layer 214 is higher than the upper surface 304 of the metal heat slug 300, a process such as etching may be performed to remove at least the part of the second dielectric layer 214 on the metal heat slug 300 to expose the metal heat slug 300.

Figure 12:
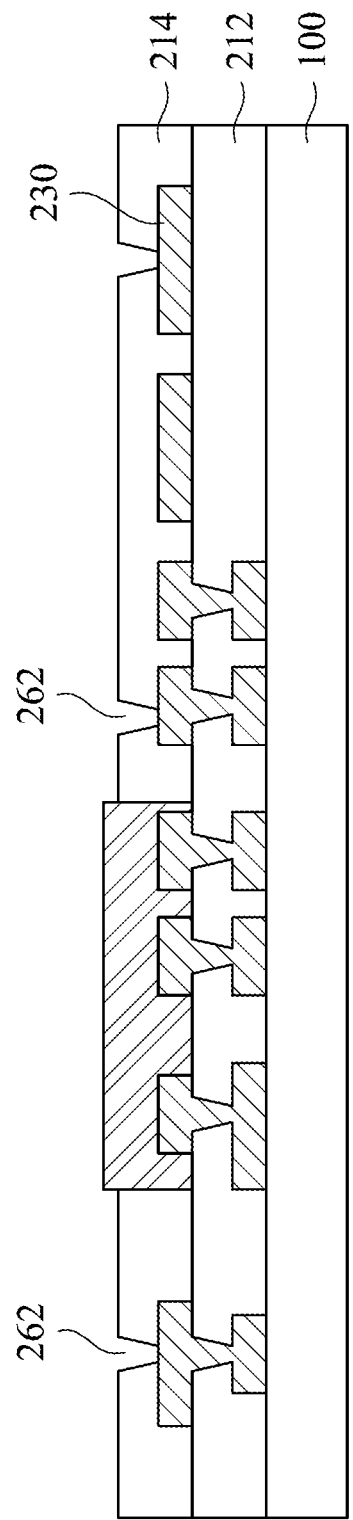

Next, as shown in FIG. 12, a plurality of second via openings 262 are formed in the second dielectric layer 214. The second via openings 262 expose parts of the second patterned circuit layer 230. In some embodiments, forming the second via openings 262 may include using, for example, laser-drilling process or exposure development process.

Figure 13:
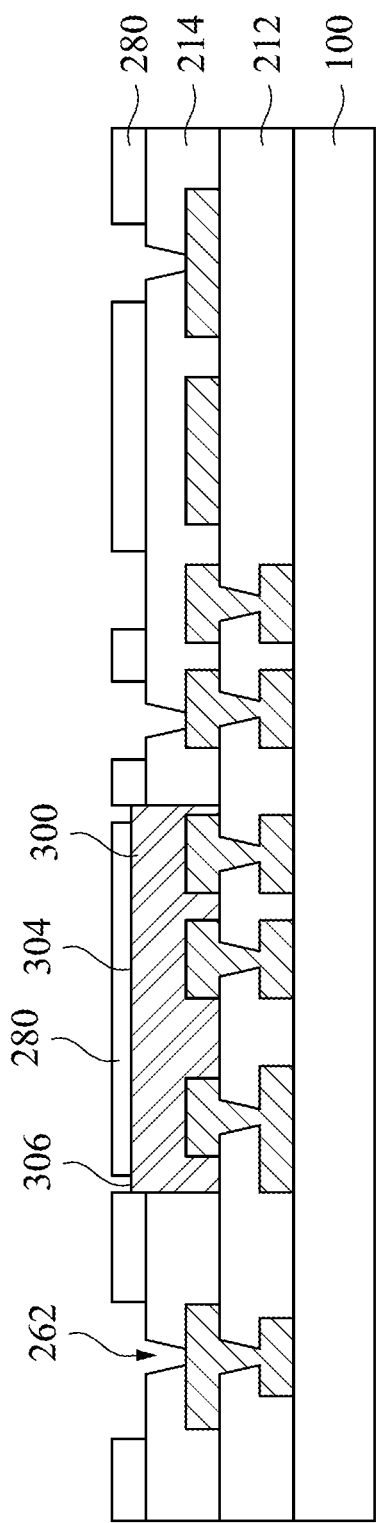
Figure 14:
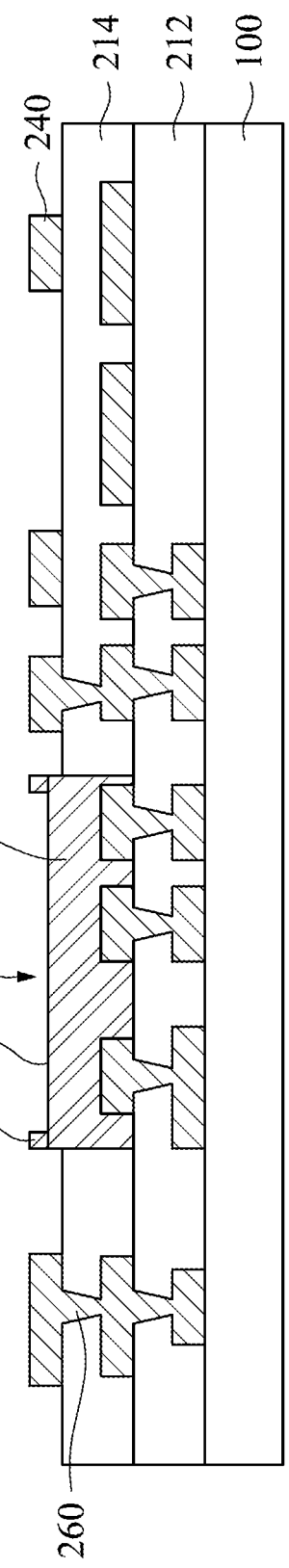

Next, as shown in FIGS. 13 and 14, a third patterned circuit layer 240 is formed, the positions of the fixing pieces on the upper surface 304 of the metal heat slug 300 are defined, and the fixing pieces are formed. FIG. 13 illustrates that a photoresist layer 280, for example, a dry film, is formed on the second dielectric layer 214; then, the photoresist layer 280 is patterned by a lithography process to expose parts of the second dielectric layer 214, the second via openings 262, and edge parts 306 of the upper surface 304 of the metal heat slug 300. Then, a deposition process such as electroplating and a removal process for the photoresist layer 280 are performed. As shown in FIG. 14, the second vias 260, the third patterned circuit layer 240, and the fixing pieces 320 on the upper surface 304 of the metal heat slug 300 are formed. The fixing pieces 320 define a concave 310 on the upper surface 304 of the metal heat slug 300. The concave 310 is used to place the chip 400 in a subsequent process, i.e., the concave 310 is a chip placement area. The height of the fixing pieces 320 can be adjusted according to the height of the chip. For example, the height of the fixing pieces 320 is designed to be equal or lower than the height of the chip to be placed, so as to prevent the mounting device from touching the fixing piece 320 on the metal heat slug 300 during the mounting process.

Figure 15:
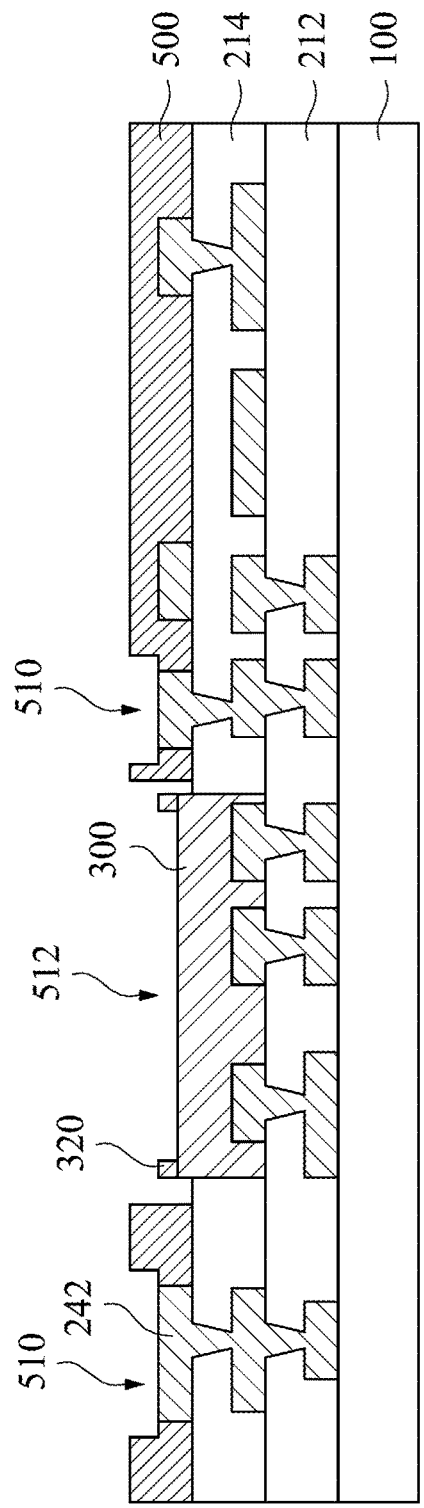

Next, as shown in FIG. 15, a solder mask layer 500 is formed over the second dielectric layer 214. The solder mask layer 500 is configured to protect the underlying laminar circuit structure. The material of the solder mask layer 500 may be, for example, green lacquer or other suitable materials. As shown in FIG. 15, the solder mask layer 500 has a plurality of openings 510 exposing portions of the third patterned circuit layer 240. The exposed portions of circuits are configured to form electrical connection pads 242. The solder mask layer 500 also has an opening 512 exposing the metal heat slug 300.

Figure 16:
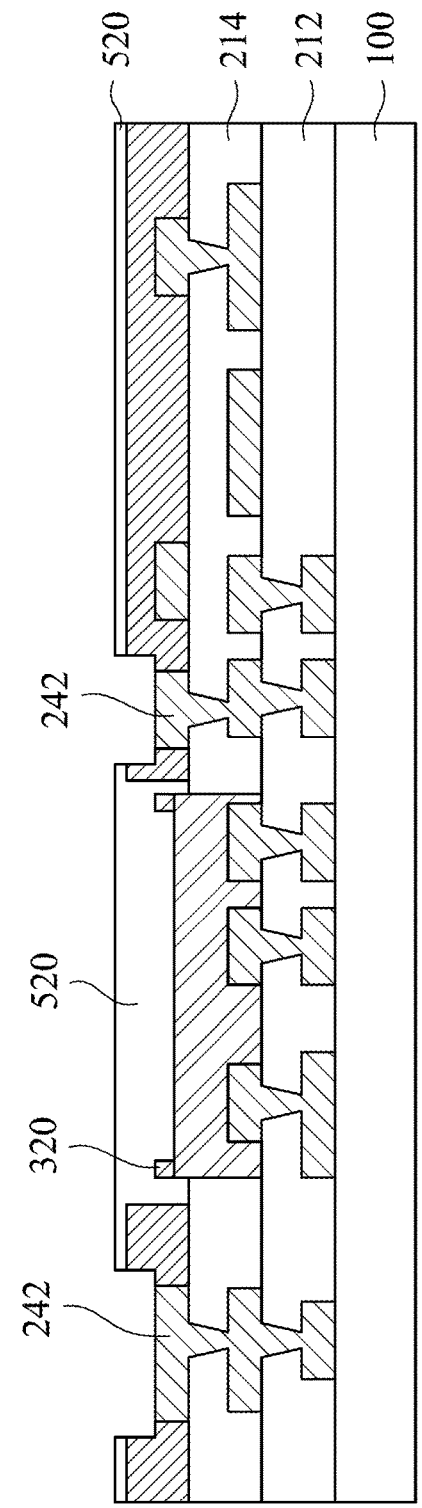

FIGS. 16 through 18 illustrate performing surface treatment on the electrical connection pad 242. At first, as shown in FIG. 16, a photoresist layer 520 (for example, a dry film photoresist layer is disposed and pressed) is formed on the solder mask layer 500; then, the photoresist layer 520 is patterned by a lithography process to expose the electrical connection pads 242. As shown in FIG. 16, the photoresist layer 520 completely fills the opening exposing the metal heat slug 300 (i.e., the opening 512 in FIG. 15). Thereafter, as shown in FIG. 17, a surface treatment is performed on the upper surface of the electrical connection pad 242 to form a surface treatment layer 244. The material of the surface treatment layer 244 may comprise copper, tin, lead, nickel, gold, platinum, the combination thereof, or the alloy thereof, for example, nickel gold. The surface treatment layer 244 may be formed by electroplating, physical vapor deposition, chemical vapor deposition, or the like. The surface treatment layer 244 is configured to enhance the electrical connection between the electrical connection pad 242 and the wire and to protect the electrical connection pad 242. Then, as shown in FIG. 18, the photoresist layer 520 is removed; therefore, the metal heat slug 300 is exposed again in the opening 510 of the solder mask layer 500.

Figure 19:
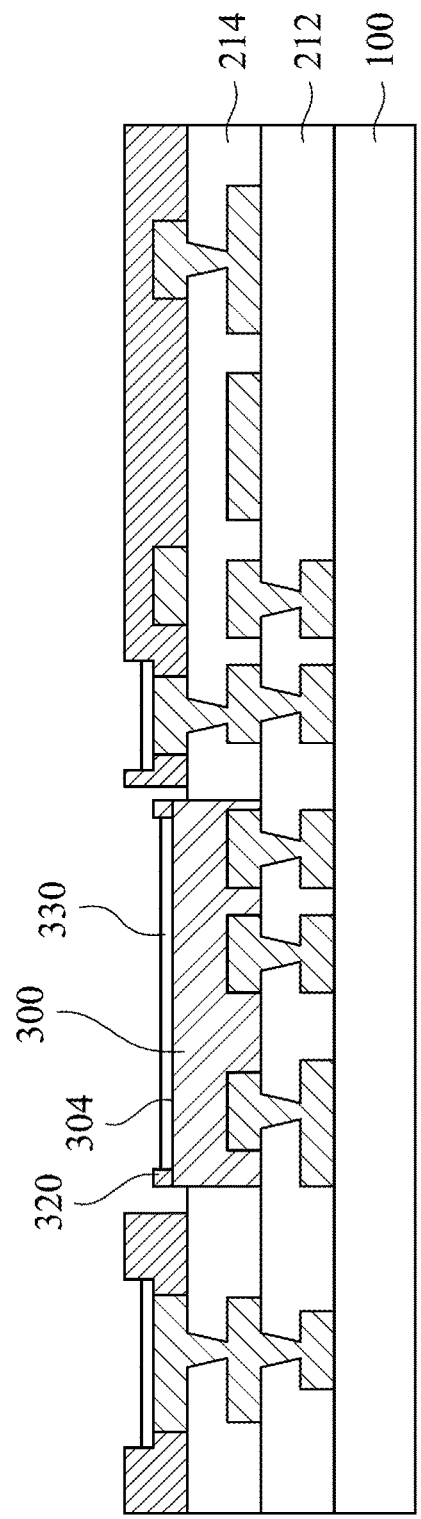

Next, as shown in FIG. 19, an adhesive layer 330 is coated on the upper surface 340 of the metal heat slug 300. Optionally, the material of the adhesive layer 330 is viscous and has good thermal conductivity, such as thermal grease, for adhering the chip, removing air or gaps at the interface, and increasing heat conduction.

Figure 20:
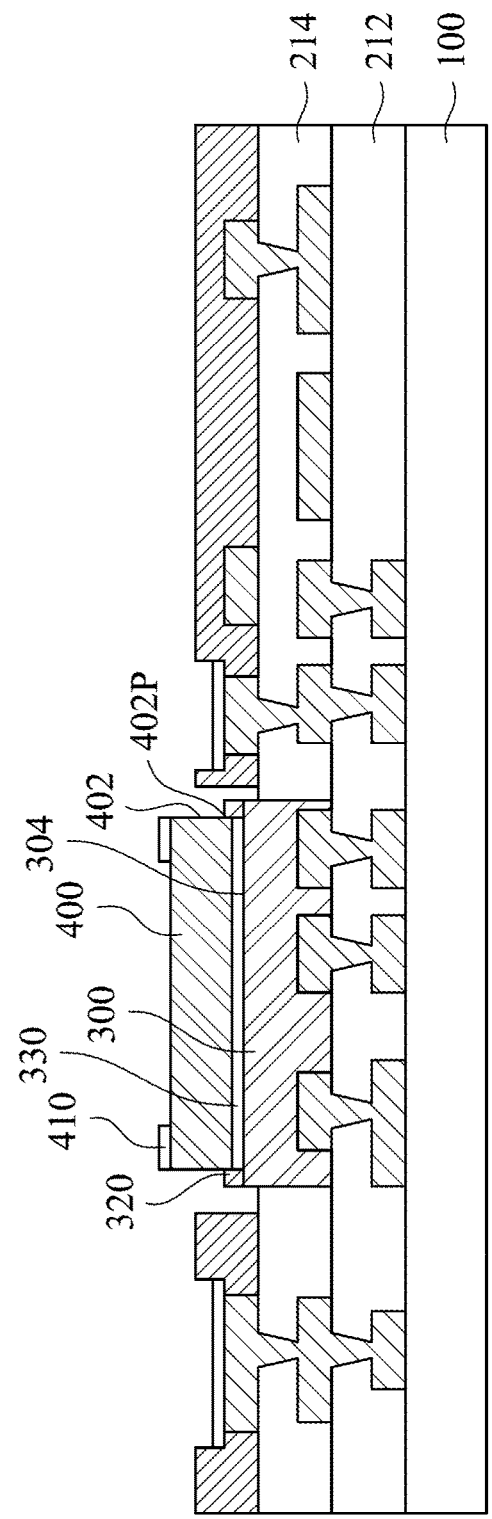

Next, as shown in FIG. 20, the chip 400 is placed on the metal heat slug 300, for example, the chip 400 is located between the fixing pieces 320. In some embodiments, the chip 400 can be placed on the metal heat slug 300 by means of vacuum absorption or gripping through using the packaging apparatus (e.g., a robotic arm).

In the prior art, the chip is adhered in the circuit carrier by an adhesive layer; however, before the curing of the adhesive layer, the position of the chip may shift. In the embodiments of the present disclosure, the structure of the fixing piece is used to fix the chip at a predetermined position in the circuit carrier, so that the shift after the placement of the chip is reduced.

The chip 400 may be electronic components of various integrated circuits that including discrete components, active or passive elements, digital or analog circuits, ECM, DRAM, SRAM, optoelectronic devices, micro electro mechanical systems (MEMS), microfluidic systems, or physical sensors that measures the variation of some physical quantities such as heat, light, or pressure, RF circuits, accelerators, gyroscopes, micro actuators, surface acoustic component, pressure sensors, or the like, but is not limited thereto.

As shown in FIG. 20, the chip 400 is placed on the upper surface 304 of the metal heat slug 300 by the adhesive layer 330. In addition, a portion of the side 402 (e.g., the first portion 402P) of the chip 400 contacts the fixing piece 320.

Figure 21:
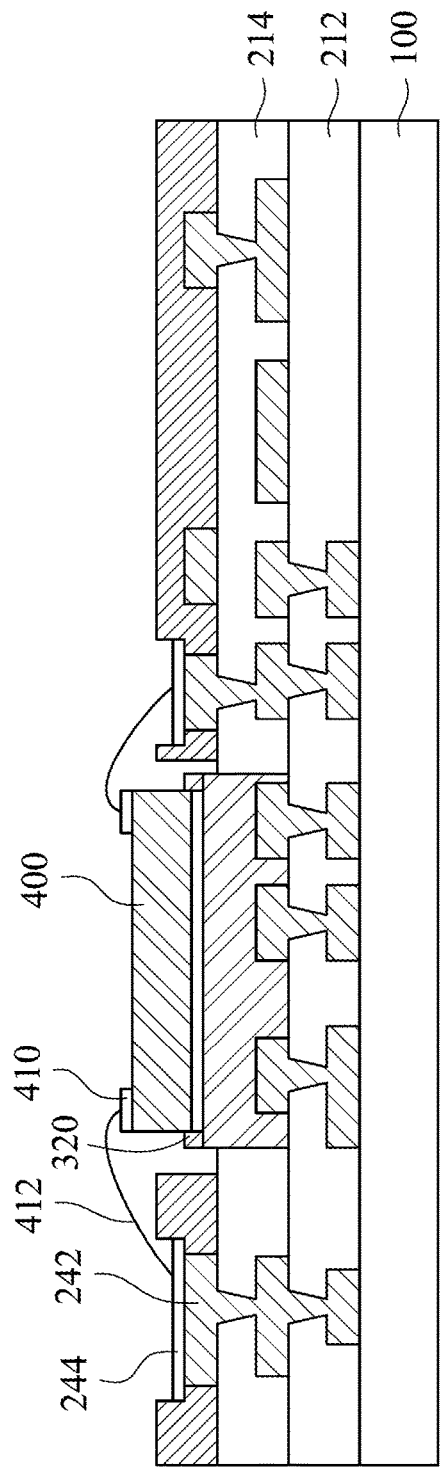

Thereafter, as shown in FIG. 21, wire bonding is performed to electrically connect the chip 400 to the circuits of the laminar circuit structure. For example, a wire 412 (e.g., a gold wire) is bonded to the pad 410 on the chip 400, and the other end of the wire 412 is bonded to the electrical connection pad 242.

Figure 22:
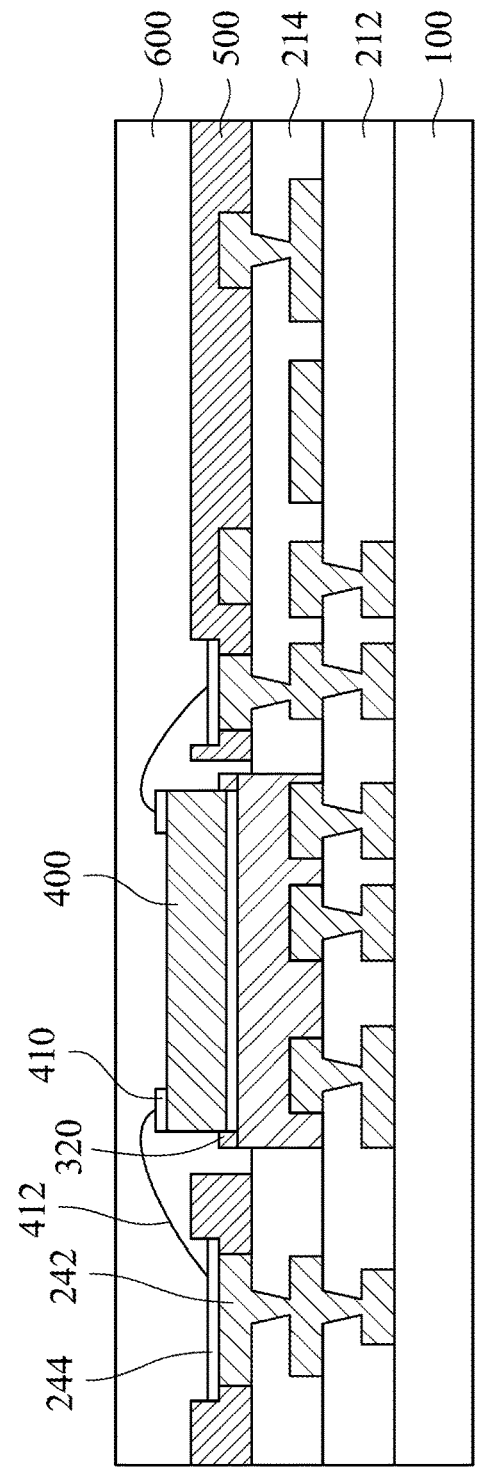

Then, as shown in FIG. 22, a molding process is performed. The molding layer 600 covers the chip 400, the wire 412, the surface treatment layer 244, and the solder mask layer 500. The molding layer 600 also fills the gaps between the chip 400 and the solder mask layer 500. The material of the molding layer 600 may include polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, silicone, or the like.

The embodiments of the present disclosure provide a circuit carrier having fixing pieces and a method of fabricating the same, to facilitate reducing the shift of an electronic component in the circuit carrier. This fixing pieces also provide positioning function during the placement of the chip. Therefore, the fixing pieces improve the accuracy of the processing and also reduce the shift of the chip before curing the adhesive layer. In some embodiments, the fixing pieces can provide heat dissipation function, the same as the metal heat slug. In other words, the fixing pieces located on the metal heat slug can increase the heat dissipation area on the side of the chip. In addition, in some embodiments, the metal heat slug is disposed to be in contact with a portion of the circuit in the laminar circuit structure; therefore, the metal heat slug can provide electrically conductive function, or the circuit portion which contacts the metal heat slug can also provide the path of heat dissipation, so that the heat generated from the chip can be more efficiently transmitted to the outside environment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit carrier comprising:
   a substrate;
   a laminar circuit structure disposed on the substrate, wherein the laminar circuit structure comprises a plurality of dielectric layers and circuits in the dielectric layers;
   a metal heat slug disposed in the laminar circuit structure, wherein the metal heat slug having an upper surface comprising an electronic component placement area and sides surrounding the electronic component placement area;
   a first fixing piece disposed on a first side of the sides of the upper surface of the metal heat slug; and
   a second fixing piece disposed on a second side of the sides of the upper surface of the metal heat slug, wherein the first side is perpendicular to the second side.

2. The circuit layer of claim 1, wherein the first fixing piece and the second fixing piece are configured to position an electronic component disposed on the metal heat slug.

3. The circuit carrier of claim 1, wherein the first fixing piece is connected to the second fixing piece.

4. The circuit carrier of claim 1, wherein the first fixing piece and the second fixing piece are separated from each other.

5. The circuit carrier of claim 1, further comprising: a third fixing piece and a fourth fixing piece, wherein the first fixing piece, the second fixing piece, the third fixing piece, and the fourth fixing piece are respectively located on one of the sides of the upper surface of the metal heat slug.

6. The circuit carrier of claim 1, wherein the metal heat slug contacts a portion of the circuits.

7. The circuit carrier of claim 1, wherein the first fixing piece, the second fixing piece, and the metal heat slug have a same material.

8. A method for manufacturing a circuit carrier, comprising:
- forming a precursor laminar circuit structure on a substrate, wherein the precursor laminar circuit structure comprises a first dielectric layer and a patterned circuit layer;
- disposing a metal heat slug on the precursor laminar circuit structure, wherein the metal heat slug having an upper surface comprising an electronic component placement area and sides surrounding the electronic component placement area;
- forming a second dielectric layer over the precursor laminar circuit structure, wherein the second dielectric layer surrounds the metal heat slug; and
- disposing a first fixing piece and a second fixing piece on the upper surface of the metal heat slug, wherein the first fixing piece is located on a first side of the sides of the upper surface, the second fixing piece is located on a second side of the sides of the upper surface, and the first side is perpendicular to the second side.

9. The method for manufacturing the circuit carrier of claim 8, wherein the step of disposing the metal heat slug on the precursor laminar circuit structure comprises:
- depositing a metal material on the precursor laminar circuit structure to form the metal heat slug; or
- bonding a metal block with the precursor laminar circuit structure.

10. The method for manufacturing the circuit carrier of claim 8, wherein the step of disposing the first fixing piece and the second fixing piece on the upper surface of the metal heat slug comprises:
- defining positions for the first fixing piece and the second fixing piece by a lithography process; and
- forming the first fixing piece and the second fixing piece on the positions by a deposition process.

* * * * *